United States Patent [19]
Harding et al.

[11] Patent Number: 5,572,207
[45] Date of Patent: Nov. 5, 1996

[54] METHOD AND APPARATUS FOR NUMERIC-TO-STRING CONVERSION

[75] Inventors: Stephen S. Harding; Jody L. Mace, both of Charlotte; Edward R. Swiatek, Concord, all of N.C.

[73] Assignee: International Business Machines Corporation, Armonk, N.Y.

[21] Appl. No.: 311,699

[22] Filed: Sep. 23, 1994

[51] Int. Cl.⁶ .................................................. H03M 7/00
[52] U.S. Cl. ............................................................ 341/62
[58] Field of Search .................................. 341/50, 51, 55, 341/62; 364/521; 395/375

[56] References Cited

U.S. PATENT DOCUMENTS

| | | | |
|---|---|---|---|
| 4,584,561 | 4/1986 | Bernardson | 340/347 DA |
| 4,584,563 | 4/1986 | Bernardson | 340/347 DA |
| 4,596,039 | 6/1986 | Mitchell et al. | 382/56 |
| 4,782,463 | 11/1988 | Sanders | 364/900 |
| 4,866,445 | 9/1989 | Valero et al. | 341/106 |
| 4,905,002 | 2/1990 | Jones et al. | 341/77 |
| 4,989,000 | 1/1991 | Chevion et al. | 341/107 |
| 5,036,457 | 7/1991 | Glaser et al. | 364/200 |
| 5,173,694 | 12/1992 | Lynch, Jr. et al. | 341/59 |
| 5,208,834 | 5/1993 | Frederickson | 375/25 |
| 5,227,893 | 7/1993 | Ett | 358/400 |
| 5,233,698 | 8/1993 | Zuk | 395/375 |

FOREIGN PATENT DOCUMENTS

| | | | |
|---|---|---|---|
| 1314020 | 12/1989 | Japan | H03M 7/12 |
| 9200631 | 1/1992 | WIPO | H03M 1/68 |

OTHER PUBLICATIONS

IBM Technical Disclosure Bulletin, vol. 27, No. 5, pp. 2969–2962, Oct. 1984, K. Hirobe and J. Okumura, "Two--Byte Code Conversion Method".

International Technology Disclosures, vol. 9, No. 3, Mar. 25, 1991, reproduced from International Technology Disclosures, Inc., J. S. Bordovsky, D. W. Cawthron, J. H. Saxman, K. D. Thompson, "Support Processor Pre-Processed Load Files". Abstract TP-39110-A, p. 2.

Abstract RD-325012-A, p. 1, Author Anonymous, May 10, 1991.

*Primary Examiner*—Brian K. Young

[57] ABSTRACT

An apparatus and method for converting a numeric representation of a number stored in a memory into a string representation of the number. Numeric representation includes an integer portion and may include a fractional portion. The numeric representation is rounded to a specified amount of precision. Each digit of the integer portion is converted to a string character in accordance with the invention. Each digit of the fractional portion, if any, is also converted to a string character. Appropriate "negative" signs and decimal points are created as required. The invention is also embodied as an article of manufacture.

8 Claims, 4 Drawing Sheets

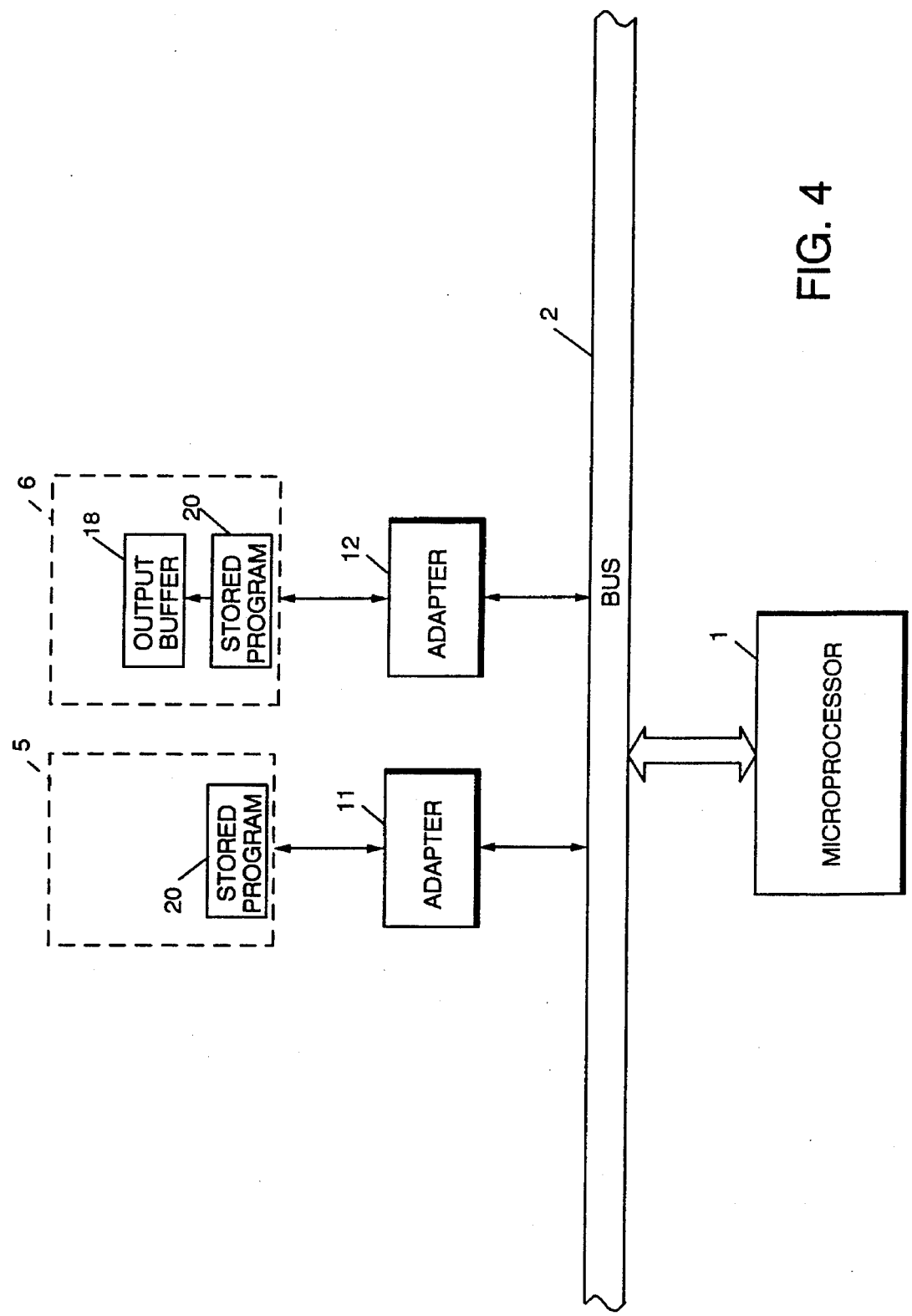

1

METHOD AND APPARATUS FOR NUMERIC-TO-STRING CONVERSION

BACKGROUND OF THE INVENTION

1. Field of the Invention

The present invention relates to an apparatus and method for numeric-to-string conversion. More particularly, the present invention relates to an apparatus and method for converting a digital computer representation of a number from a numeric representation to a string (or text) representation.

2. Description of Related Art

As used herein, the "data" means a representation of facts, concepts or instructions in a formalized manner suitable for communication, interpretation, or processing by human or automatic means. Also, as used herein, "computer" includes a device capable of performing the functions of a Turing Machine, including a microcomputer, minicomputer, or mainframe computer. A Turing Machine is a well-known computer science concept and is explained in Encyclopedia of Computer Science, Ed. Anthony Ralston, ISBN 0-88405-321-0 ("the Ralston text"), which is specifically incorporated herein by reference. "Memory" includes one or more devices for storing data for use by a computer, including electronic, magnetic, and electro-magnetic memory.

Various data representations are used in connection with digital computers in order to manipulate information. Different representations are used depending upon the objective. For example, some representations are better suited for performing arithmetic operations (e.g., adding, subtracting, multiplying), while others may be particularly suited for text processing (e.g., word processing). The choice of representation is typically of no direct concern to an end user of a computer or computer program, however it is nevertheless important since it may profoundly affect the efficiency of a system. Data representations and operations thereon are discussed in The Art of Computer Programming, D. E. Knuth, vols. 1–3, Addison-Wesley, which is specifically incorporated herein by reference.

Often, information must be converted from one data representation to another. The results of arithmetic operations performed on numeric representations of data, for example, may need to be displayed to an end user as text on a display. The present invention relates to such conversions. The invention is of particular importance with respect to converting floating point numbers into string representations.

In general, a floating point number, FP, is represented in binary notation in two parts: a mantissa (or significand), M, and an exponent, E, where $FP = M \times 2^E$. Typically, the leftmost bit of each part denotes the sign, where "0" denotes a positive number and "1" denotes a negative number. Leading zeros in the mantissa are omitted in order to provide the maximum number of significant digits. The number of bits used to represent FP is a function of the width of the internal high-speed registers and buses for a particular computer. Numeric data representations, including floating point representations, are discussed more fully in the Ralston text.

A specific example of floating point representation is the IEEE 754 specification for the format of a long double number. 80 bits are used and are organized as shown below:

| 1 bit | 15 bits | 1 bit | 63 bits |
|---|---|---|---|
| s | Biased exponent | 1 | mantissa |
| 79  78 | | 63  62 | 0 | where
- s=sign bit (0=positive, 1=negative),
- i=position of the implicit "binary" point,
- 1=integer bit of mantissa, and
- exponent bias=16,383 (3FFFH).

Strings, or text, on the other hand, are typically represented by a sequence of fixed length codes, where each code represents a particular character or symbol. American Standard Code for Information Interchange (ASCII) and Extended Binary-Coded Decimal Interchange Code (EBCDIC) are two well-known and widely used encoding schemes for character sets. Eight-bit codes are typically used in each coding scheme to represent individual characters. ASCII and EBCDIC are discussed more fully in the Ralston text.

A number of commercially available compilers contain numeric-to-string conversion facilities. MICROSOFT C, Version 6.0, IBM C Set/2, and BORLAND C++ compilers, in particular, use the "sprintf" library function to convert numbers to ASCII strings.

SUMMARY OF THE INVENTION

The present invention overcomes the disadvantages and limitations of the related art by providing an apparatus and method for converting a digital computer representation of a number from a numeric representation to a string (or text) representation.

An apparatus and method for converting a numeric representation of a number stored in a memory into a string representation of the number. Numeric representation includes an integer portion and may include a fractional portion. The numeric representation is rounded to a specified amount of precision. Each digit of the integer portion is converted to a string character in accordance with the invention. Each digit of the fractional portion, if any, is also converted to a string character. Appropriate "negative" signs and decimal points are created as required. The conversion mechanism is preferably a stored computer program operating in combination with a computer. The invention is also embodied as an article of manufacture on a diskette or other storage medium. Alternatively, the mechanism may be implemented in electronic circuitry.

An advantage of the invention is that it provides an improved method and apparatus for converting a digital computer representation of a number from a numeric representation to a string (or text) representation.

Another advantage of the numeric-to-string conversion invention is that it performs conversions quickly.

Yet another advantage of the numeric-to-string conversion invention is that it performs rounding in connection with conversions accurately.

The foregoing and other advantages of the present invention will be apparent to those skilled in the art of information handling technology in view of the accompanying drawings, description of the invention, and appended claims.

BRIEF DESCRIPTION OF THE DRAWINGS

FIG. 4 is a block diagram of a portion of the data processing system in FIG. 1 depicting the invention in apparatus and article of manufacture form.

DESCRIPTION OF THE PREFERRED EMBODIMENTS

Figure 1:
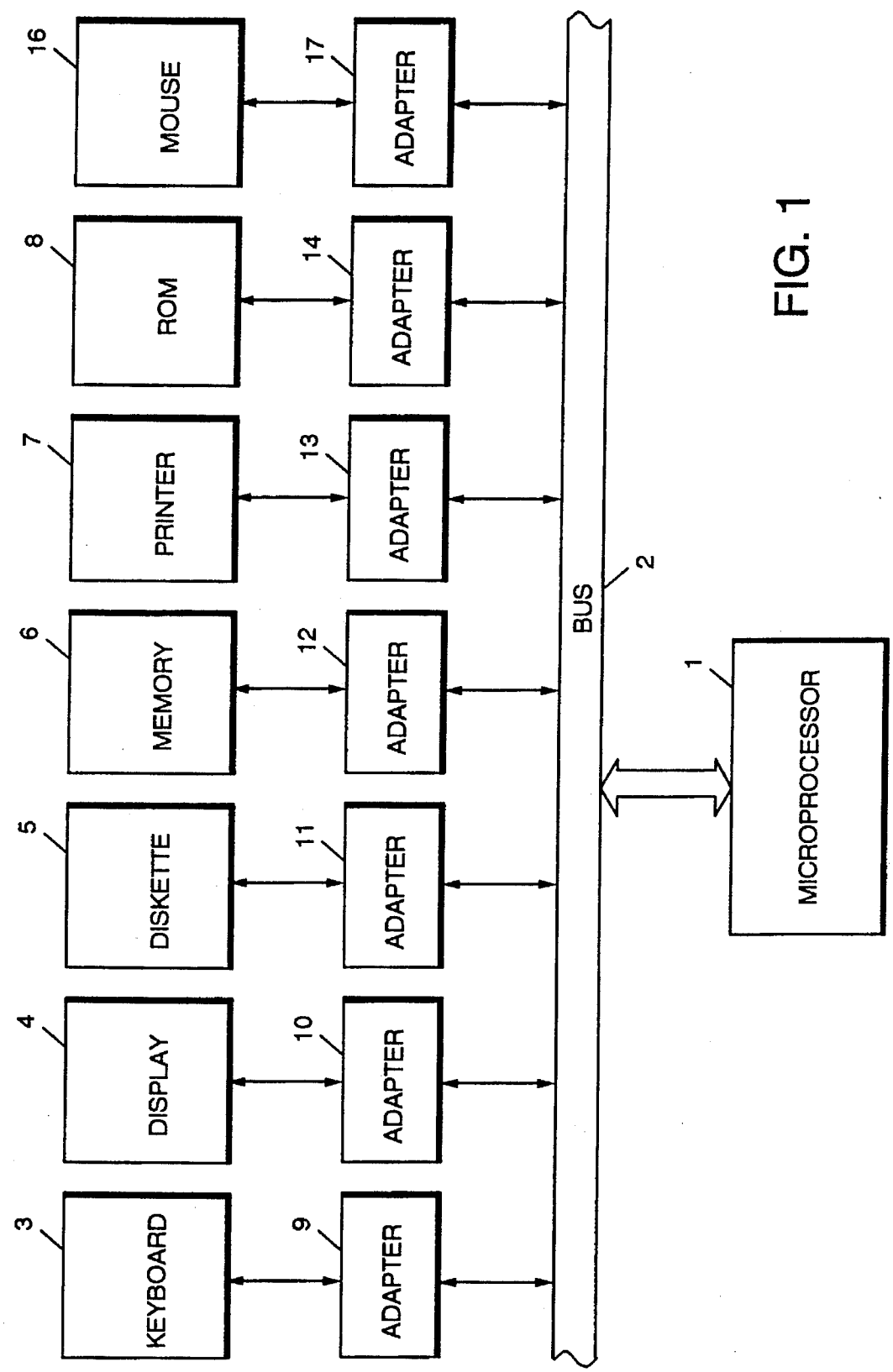
FIG. 1 is a block diagram of a data processing system which includes a stored program for performing the function of the invention in conjunction with the data processing system.

Referring now to FIG. 1, a typical personal computer architecture is shown, such as the configuration used in the IBM Personal Computer or the IBM PS/2® computer. The present invention may also be used in other digital computer architectures, such as mini-computer and mainframe computer environments.

The focal point of the preferred personal computer architecture comprises a microprocessor 1 which may, for example, be an INTEL 8088, 386, 486, or similar microprocessor. The microprocessor 1 is connected to a bus 2 which comprises a set of data lines, a set of address lines and a set of control lines. A plurality of I/O devices or memory or storage devices 3–8 and 16 are connected to the bus 2 through separate adapters 9–14 and 17, respectively. For example, the display 4 may be the IBM Personal Computer Color Display and the adapter 10 may, accordingly, be the IBM Color/Graphics Adapter. The other devices 3 and 5–8 and adapters 9 and 11–14 are either included as part of the personal computer or are available as plug-in options from the IBM Corporation.

The random access memory (RAM) 6 and the read-only memory (ROM) 8 and their corresponding adapters 12 and 14 are included as standard equipment in a personal computer, although additional random access memory to supplement memory 6 may be added via a plug-in memory expansion option.

Within the ROM 8 are stored a plurality of instructions, known as the basic input/output operating system, or BIOS, for execution by the microprocessor 1. The BIOS controls the fundamental operations of the computer. An operating system such as the IBM Personal Computer Series Disk Operating System by Microsoft Corporation (DOS), or the IBM OS/2 operating system software by IBM Corporation, most commonly used with the IBM personal computer family, is loaded into the memory 6 and runs in conjunction with the BIOS stored in ROM 8. It will be understood by those skilled in the art that the personal computer system could be configured so that parts or all of the BIOS are stored in the memory 6 rather than in the ROM 8 so as to allow modifications to the basic system operations by changes made to the BIOS program, which would then be readily loadable into the random access memory 6. Similarly, programs stored in memory 6 may be stored in ROM 8.

An application program such as a word processing program may also be loaded into the memory 6 to provide instructions to the microprocessor 1 to enable a comprehensive set of word processing tasks, including the creation and revision of text documents, to be performed by the personal computer system shown in FIG. 1. An application program loaded into the memory 6 is said to run in conjunction with the disk operating system previously loaded into the memory 6.

When using a computer such as the IBM Personal Computer for the system shown in FIG. 1, an input device such as a mouse 16 and an adapter may, for example, comprise the MICROSOFT MOUSE. This mouse is available in either a serial version, which plugs into an Asynchronous Communications Adapter available for the IBM Personal Computer, or in a bus version which includes an adapter card which plugs into an accessory slot in the IBM Personal Computer. Mouse 16 is an input device for interacting with the personal computer. Other input devices include keyboards, tablets, touch screens, light pens, joysticks, trackballs, and similar devices.

Personal computer architecture and components are further explained in The Winn Rosch Hardware Bible, by Winn L. Rosch, ISBN 0-13-160979-3, published by Simon & Schuster, Inc., New York, N.Y. (1989), which is specifically incorporated herein by reference.

Figure 2:
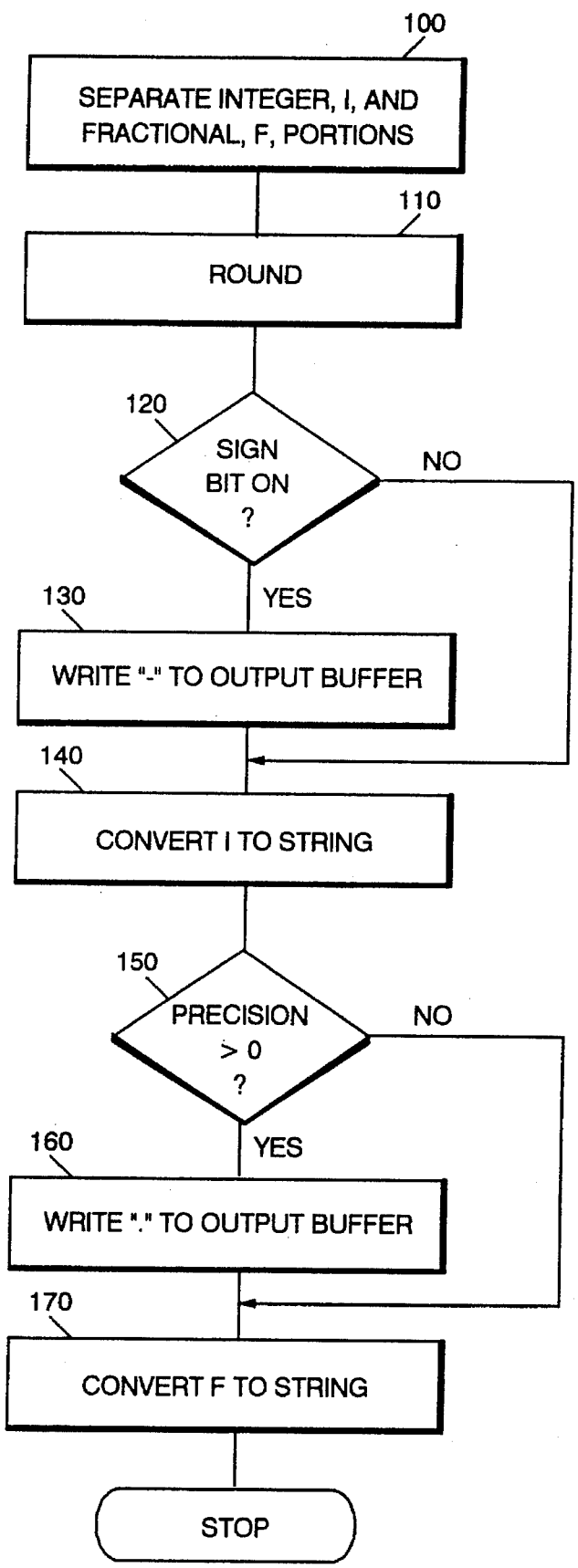
FIG. 2 is a flowchart of the invented method for converting a digital computer representation of a number from a numeric representation to a string (or text) representation.

In operation, as generally depicted in FIG. 2, the present invention converts a numeric representation of number (e.g., FP) into a string representation of the number in accordance with a specified amount of precision, as described below. In step 100, the mantissa, M, is separated into an integer portion, I, and a fractional portion, F, by a shifting operation using the unbiased exponent, E. For each position that the implicit "binary" point is moved to the left, the exponent increases by one. If it is moved to the right, the exponent decreases by one.

In step 110, rounding is performed by adding a rounding factor that is based on the specified precision. For each specified precision value, a corresponding rounding constant is added to the number. The result is truncated at the appropriate precision digit. The effect is a revised number which is closest to the original number for the amount of precision specified. The constant increases the least significant digit by one if the digits below it are greater than or equal to five. Otherwise, the number is truncated. Preferably, a table containing the rounding constants for each level of precision up to 14 digits is used. If a precision of greater than 14 digits is required, the table can be expanded. Alternatively, the rounding constants can be computed.

For example, if the first number is 1.235 and the amount of precision specified is two, then adding 0.005 to the number results in a second number, 1.240. The second number is truncated after the first two digits of precision, 1.24, and lost digits are discarded. However, if the first number is 1.234, and the amount of precision specified is again two, then adding 0.005 results in a second number 1.239. The second number is truncated at the appropriate precision digit resulting in 1.23.

If the sign bit for the number is on (e.g., is set to "1"), step 120, then a negative sign '−' is generated in step 130. Typically, the sign will be output to an output buffer 18 which will ultimately contain the entire string representation of the number. It can also be output to some other memory or a display.

In step 140, the integer portion of the mantissa is converted to string representation by iteratively dividing the integer portion of the number by ten and extracting the remainder. The remainder produced in this way is converted to a string representation and placed into the output buffer 18. The string representation will typically be a code from the 8-bit version of the ASCII character set (e.g., the decimal number "5" is encoded in ASCII as a decimal "53", binary "00110101", or hexadecimal "35"). Other string representations, such as EBCDIC, can also be used. A table lookup operation is preferably performed to locate the string representation code associated with the computed remainder. The integer portion of the decimal number is constructed in this way beginning with the units digit. The string representation is therefore generated in reverse order. In one implementation, each digit is pushed onto a stack until the entire integer portion has been converted. Then, each of the digits is popped off the stack and into the output buffer.

Figure 3:
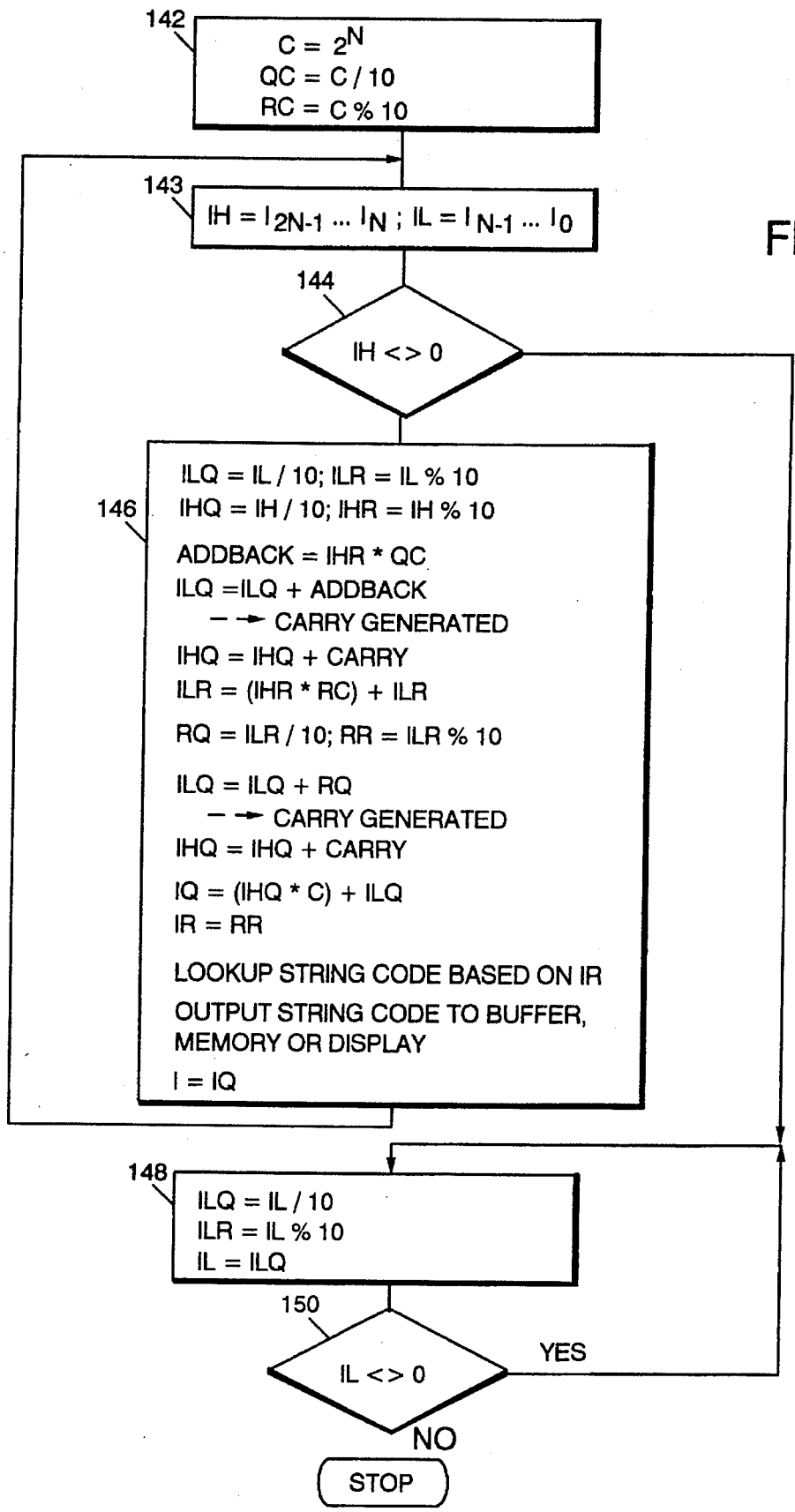
FIG. 3 is a flowchart of the integer-to-string conversion portion of the invented numeric-to-string conversion method.

For a computer capable of performing division on N-bit integers, steps 142 to 146 of FIG. 3 illustrate an embodiment of the required division-by-ten operation of step 140 on any 2N-bit integer portion of the mantissa. The division-by-ten operation can be applied recursively with respect to 4N, 8N, . . . etc., integer division. In general, division of the high-order word of N-bits by ten is equivalent to dividing it by ten times two to the Nth power. This results in a remainder that can be adjusted, combined with the remainder of the division of the low order word by ten, and "added back in" to the two word quotients and remainders to compute the desired 2N-bit values.

As depicted in FIG. 3, step 142, a constant, $C=2^N$, is calculated. Then, C is divided by ten, which results in computing two conversion constants: a quotient, QC=C/10, and a remainder, RC=C % 10.

In step 146, the 2N-bit integer portion, I, is separated into two N-bit words: a high order N-bit word, $IH=I_{2N-1} \ldots I_N$, and a low order N-bit word, $IL=I_{N-1} \ldots I_0$. The following relationship holds: I=(IH*C)+IL.

The low-order N-bit number, IL, is divided by 10 and the quotient, ILQ=IL/10, and remainder, ILR=IL % 10, are saved. The high-order N-bit number, IH, is also divided by 10 and the quotient, IHQ=IH/10, and remainder, IHR=IH % 10, saved.

The high-order remainder, IHR, is multiplied by the quotient conversion constant, QC, to obtain a value referenced herein as ADDBACK. The ADDBACK value is added back into the low-order quotient value, ILQ=ILQ+ADDBACK, and a carry propagated into the high-order quotient, IHQ=IHQ+CARRY. This results in an approximate quotient.

A cumulative remainder is computed by combining the high-order remainder, IHR, multiplied by the remainder conversion constant, RC, and adding it to the low-order remainder, ILR=(IHR*RC)+ILR. After this operation, the cumulative remainder may be greater than the divisor, 10. Consequently, it is divided by ten, which results in a cumulative remainder quotient, RQ=ILR/10, and remainder, RR=ILR % 10.

The RQ value is added back into the low-order quotient value, ILQ=ILQ+RQ, and the carry propagated into the high-order quotient, IHQ=IHQ+CARRY. This results in an exact quotient.

The quotient of the division, IQ, is now contained in IHQ and ILQ. The remainder, IR, is the value RR, which is the desired conversion digit in the range 0 through 9. In order to convert the next digit, I is set to IQ, and the process continues with step 144. The process continues until the quotient, IQ, reaches zero.

Preferably, as depicted in steps 148 and 150, a fast path loop can be executed once the high-order value IH reaches zero. In this situation, combination of the high order division with ADDBACK becomes unnecessary since the quotients and remainders resulting from that division are always zero. A simple N-bit division using IL only can be performed which increases execution speed.

The following pseudocode illustrates one embodiment for converting the integer portion of the mantissa into a string representation:

given a binary representation of an integer, I, composed of 2N
bits, $I_{2N-1} \ldots I_0$, where "=" denotes assignment; "/" denotes
division; "%" denotes remainder; "*" denotes multiplication;
"+" denotes addition; "<>" denotes not equal; "-->" denotes
carry; I and IQ are 2N-bit wide values; and all other
variables are N-bit wide values,
$C = 2^N$; QC = C / 10; RC = C % 10
while I <> 0 do
    $IH = I_{2N-1} \ldots I_N$; $IL = I_{N-1} \ldots I_0$
    ILQ = IL / 10; ILR = IL % 10
    IHQ = IH / 10; IHR = IH % 10
    ADDBACK = IHR * QC
    ILQ = ILQ + ADDBACK --> CARRY generated
    IHQ = IHQ + CARRY
    ILR = (IHR * RC) + ILR
    RQ = ILR / 10; RR = ILR % 10
    ILQ = ILQ + RQ --> CARRY generated
    IHQ = IHQ + CARRY
    IQ = (IHQ * C) + ILQ
    IR = RR
    LOOKUP STRING CODE BASED ON IR
    OUTPUT STRING CODE TO BUFFER, MEMORY OR
    DISPLAY
    I = IQ
endwhile As shown in FIG. 4, a stored program 20 implementing the method is advantageously embodied as an article of manufacture by embedding the stored program onto diskette 5, or other portable storage media. Further, the stored program 20 is embodied as a special purpose apparatus by storing the program's executable instructions in memory 6, ROM 8, or a combination of both, for execution by microprocessor 1.

If the decimal precision is greater than zero, step 150, then a decimal point is placed in the output buffer 18 to the right of the unit's digit, step 160, and the fractional portion is then converted.

In step 170, if there is a fractional portion of the mantissa, each digit is extracted by multiplying by ten once for each digit of precision that is specified, and extracting the overflow digit. Preferably, the multiplication is done quickly by shifting the binary representation of the fraction to the left one place, shifting the original number to the left three places, and then adding the two shifted numbers together. For each iteration, the overflow is extracted. As each digit is extracted, it is converted to its string representation (e.g., ASCII, EBCDIC, or other similar code) and placed into the output buffer 18. The fractional portion of the number is constructed in this way beginning with the tenth's place.

Tests

The invented process, denoted "FP=>S", was tested 1275 times on 50 different randomly generated numbers. The test was conducted on a computer with an INTEL 486DX processor and on a computer with an INTEL 386DX processor with no math coprocessor. The test compared the present invention, implemented using assembly language (MICROSOFT Macro Assembler version 6.0), with calls to three commercially available sprintf C library routines. In each test, a precision of six was specified.

| Time in Seconds to Complete 1275 Long-double to ASCII Conversions | | |
| --- | --- | --- |
| | 386DX Machine (No coprocessor) | 486DX Machine (Coprocessor on chip) |
| Routine 1 | 57.688 | 0.250 |
| Routine 2 | 8.000 | 0.157 |
| Routine 3 | 2.180 | 0.380 |
| FP => S | 1.125 | 0.031 |

The FP=>S invention outperformed all three commercial library routines on both hardware platforms in the tests. Some of the performance improvement is due to limiting allowable precision. Maximum precision for FP=>S tested was 14 digits to the right of the decimal; sprintf library functions may include a higher maximum precision capability.

The rounding accuracy of the FP=>S invention was also tested against the three sprintf C library routines. Each level of decimal precision (0 through 14) was tested by converting two numbers to ASCII. The first number was slightly more than the "round-up" threshold; the second was slightly less than the "round-up" threshold. For example, for a precision of one, the numbers supplied were binary representations of 1.25000000000000000000 and 1.24999999999999999989. If properly rounded, the first number should convert to "1.3" and the second number should convert to "1.2".

For each level of decimal precision, Routine 1 correctly rounded the first number up. However, the second number was also, incorrectly, rounded-up. Routine 2 failed to round-up the first number for decimal precision specified at four, eight, and twelve. Routine 3 provided the correct results for a decimal precision of zero. For decimal precision of one through fourteen, it incorrectly rounded the first number down. The FP=>S invention performed correctly for all levels of decimal precision.

Of course, many modifications and adaptations to the present invention could be made to advantage without departing from the spirit of this invention. Further some features of the present invention could be used without corresponding use of other features. Accordingly, this description should be considered as merely illustrative of the principles of the present invention and not in limitation thereof.

We claim:

1. Method for converting a numeric representation of a number stored in a memory into a string representation of the number, said numeric representation including a 2N-bit wide integer portion, having base, B, and a fractional portion, comprising the steps of:

(a) separating the integer portion of the numeric representation from the fractional portion of the numeric representation;

(b) rounding the numeric representation of the number to a specified amount of precision;

(c) outputting a string sign symbol which indicates that the number is negative if the numeric representation of the number indicates that the number is negative;

(d) successively dividing the integer portion by an N-bit wide divisor, D, where D=B, to produce at least one digit, $I_i$, where i=0 to number of integer digits, and each $I_i$ is the corresponding remainder of each successive division;

(e) for each digit, $I_i$, (1) converting the digit, $I_i$, to a representative string symbol, $S_i$; and (2) outputting the string symbol, $S_i$;

(f) outputting a string separator symbol which separates the integer portion of the string representation from the fractional portion of the string representation if the specified amount of precision is greater than zero; and (g) for each digit comprising the fractional portion of the numeric representation, $F_j$, where j=0 to number of fractional portion digits, (1) converting the digit, $F_j$, to a representative string symbol, $S_j$; and (2) outputting the string symbol, $S_j$.

2. Numeric-to-string conversion method according to claim 1, wherein said string sign symbol is "-".

3. Numeric-to-string conversion method according to claim 1, wherein said string separator symbol is ".".

4. Numeric-to-string conversion method according to claim 1, wherein string symbols are output to a memory.

5. Numeric-to-string conversion method according to claim 1, wherein string symbols are output to a display.

6. Method for converting a numeric representation of a 2N-bit wide integer stored in a memory into a string representation of the integer having a base, B, comprising the steps of:

(a) outputting a string sign symbol which indicates that the integer is negative if the numeric representation of the integer indicates that the integer is negative;

(b) successively dividing the integer by an N-bit wide divisor, D, where D=B, to produce at least one digit, $I_i$, where i=0 to number of integer digits, and each $I_i$ is the corresponding remainder of each successive division;

(c) for each digit, $I_i$, (1) converting the digit, $I_i$, to a representative string symbol, $S_i$; and (2) outputting the string symbol, $S_i$.

7. Apparatus for converting a numeric representation of a number stored in a memory into a string representation of the number, said numeric representation including a 2N-bit wide integer portion, having base, B, and a fractional portion, comprising:

(a) means for separating the integer portion of the numeric representation from the fractional portion of the numeric representation;

(b) means for rounding the numeric representation of the number to a specified amount of precision;

(c) means for outputting a string sign symbol which indicates that the number is negative if the numeric representation of the number indicates that the number is negative;

(d) means for successively dividing the integer portion by an N-bit wide divisor, D, where D=B, to produce at least one digit, $I_i$, where i=0 to number of integer digits, and each $I_i$ is the corresponding remainder of each successive division;

(e) means for converting each digit, $I_i$, to a representative string symbol, $S_i$;

(f) means for outputting the string symbol, $S_i$;

(g) means for outputting a string separator symbol which separates the integer portion of the string representation from the fractional portion of the string representation if the specified amount of precision is greater than zero;

(h) means converting each digit comprising the fractional portion of the numeric representation, $F_j$, where j=0 to number of fractional portion digits, to a representative string symbol, $S_j$; and (i) means for outputting the string symbol, $S_j$.

8. A computer program product having a computer readable medium having computer program logic recorded thereon for converting a numeric representation of a 2N-bit wide integer stored in a memory into a string representation of the integer, having base, B, said computer program product comprising:

(a) means for outputting a string sign symbol which indicates that the integer is negative if the numeric representation of the integer indicates that the integer is negative;

(b) means for successively dividing the integer by an N-bit wide divisor, D, where D=B, to produce at least one digit, $I_i$, where i=0 to number of integer digits, and each $I_i$ is the corresponding remainder of each successive division;

(c) means for converting each digit, $I_i$, to a representative string symbol, $S_i$; and (d) means for outputting the string symbol, $S_i$.

* * * * *